United States Patent
Guevara et al.

(10) Patent No.: US 12,080,667 B2
(45) Date of Patent: Sep. 3, 2024

(54) CONDUCTIVE TERMINAL FOR SIDE FACING PACKAGES

(71) Applicant: TEXAS INSTRUMENTS INCORPORATED, Dallas, TX (US)

(72) Inventors: Rafael Jose Lizares Guevara, Makati (PH); Jose Arvin Matute Plomantes, Dagupan (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 34 days.

(21) Appl. No.: 17/677,624

(22) Filed: Feb. 22, 2022

(65) Prior Publication Data

US 2023/0268302 A1    Aug. 24, 2023

(51) Int. Cl.
H01L 23/00    (2006.01)

(52) U.S. Cl.
CPC .............. *H01L 24/13* (2013.01); *H01L 24/11* (2013.01); *H01L 24/16* (2013.01); *H01L 2224/11462* (2013.01); *H01L 2224/11515* (2013.01); *H01L 2224/11618* (2013.01); *H01L 2224/11622* (2013.01); *H01L 2224/11849* (2013.01); *H01L 2224/13005* (2013.01); *H01L 2224/13011* (2013.01); *H01L 2224/13017* (2013.01); *H01L 2224/13019* (2013.01); *H01L 2224/13147* (2013.01); *H01L 2224/13541* (2013.01); *H01L 2224/13566* (2013.01); *H01L 2224/1357* (2013.01); *H01L 2224/16058* (2013.01); *H01L 2224/16059* (2013.01); *H01L 2224/16227* (2013.01); *H01L 2224/16237* (2013.01); *H01L 2224/16238* (2013.01)

(58) Field of Classification Search
CPC ......... H01L 24/13; H01L 24/11; H01L 24/16; H01L 2224/11462; H01L 2224/11515; H01L 2224/11618; H01L 2224/11622; H01L 2224/11849; H01L 2224/13005; H01L 2224/13011; H01L 2224/13017; H01L 2224/13019; H01L 2224/13147; H01L 2224/13541; H01L 2224/13566; H01L 2224/1357; H01L 2224/16058; H01L 2224/16059; H01L 2224/16227; H01L 2224/16237; H01L 2224/16238
See application file for complete search history.

(56) References Cited

U.S. PATENT DOCUMENTS

2015/0303160 A1 * 10/2015 Tu .............................. H01L 24/05
257/737

* cited by examiner

*Primary Examiner* — Douglas W Owens
(74) *Attorney, Agent, or Firm* — Ronald O. Neerings; Frank D. Cimino

(57) ABSTRACT

An electronic device includes a semiconductor die having a first side, an orthogonal second side for mounting to a substrate or circuit board, a conductive terminal on the first side, the conductive terminal having a center that is spaced apart from the second side by a first distance along a direction, and a solder structure extending on the conductive terminal, the solder structure having a center that is spaced apart from the center of the conductive terminal by a non-zero second distance along the direction.

19 Claims, 10 Drawing Sheets

CONDUCTIVE TERMINAL FOR SIDE FACING PACKAGES

BACKGROUND

Systems having perpendicular or side facing die terminals or bumps soldered to traces of a printed circuit board (PCB) can suffer from imperfect bump wetting capability (marginal or total non-wets) caused by the volume and placement of the solder ball and under bump metallization (UBM) pad configuration. Simply increasing the solder volume (e.g., larger solder ball size) to improve marginality of perpendicular terminal wetting can increase the chance of undesired short circuits to other circuit nodes.

SUMMARY

In one aspect, an electronic device includes a semiconductor die and a solder structure, where the semiconductor die has a first side, an orthogonal second side, and a conductive terminal on the first side. The conductive terminal has a center that is spaced apart from the second side by a first distance along a direction, and the solder structure extends on the conductive terminal. The solder structure has a center that is spaced apart from the center of the conductive terminal by a non-zero second distance along the direction.

In another aspect, a system includes a circuit board, a semiconductor die, and a solder structure. The circuit board has a conductive pad extending on a circuit board side. The semiconductor die has a first side extending in a first plane of orthogonal first and second directions, a second side, and a conductive terminal on the first side. The second side extends in a second plane of the first direction and a third direction that is orthogonal to the first and second directions. The conductive terminal has a foot portion and a pillar portion. The pillar portion extends outward from the foot portion along the third direction and away from the first side, and the foot portion is wider than the pillar portion along the first direction. The conductive terminal has a center that is spaced apart from the second side by a first distance along the first direction. The solder structure extends on a portion of the conductive pad and on portions of the foot and pillar portions of the conductive terminal.

In a further aspect, a method of fabricating an electronic device includes depositing a metal seed layer on a bond pad of a first side of a semiconductor wafer, the first side extending in a plane of orthogonal first and second directions, performing a lithography process that forms a patterned plating mask with an opening has an undercut that exposes the metal seed layer, the opening has a center that is spaced apart from a prospective die second side by a first distance along the first direction, and performing an electroplating process to form a conductive terminal in the opening with a foot portion and a pillar portion, the pillar portion extending outward from the foot portion along a third direction away from the first side of the semiconductor die, the foot portion extending in the undercut and being wider than the pillar portion along the first direction, The method includes removing the plating mask, attaching a solder structure on the conductive terminal, the solder structure has a center that is spaced apart from a center of the conductive terminal by a non-zero second distance along the first direction toward the prospective die second side, the second distance being less than the first distance, and separating the semiconductor wafer into individual semiconductor des to form the die second side of the respective semiconductor dies.

DETAILED DESCRIPTION

Figure 1:
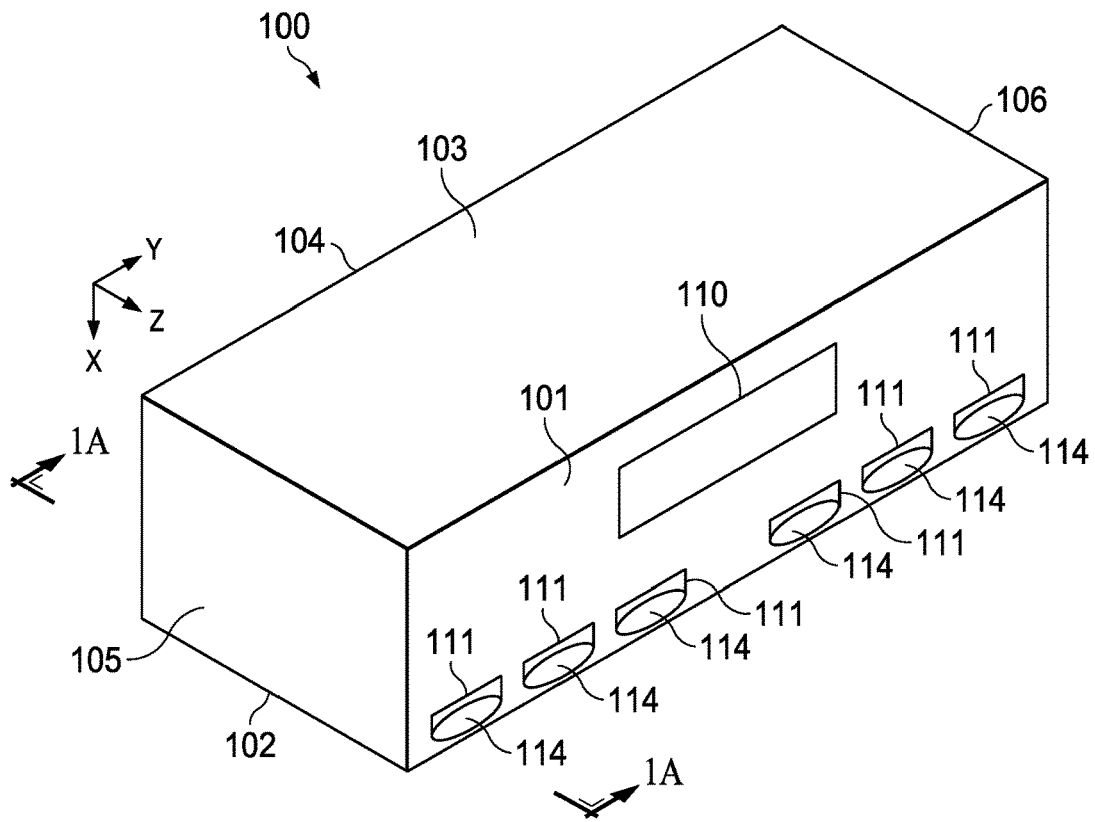
FIG. 1 is a perspective view of a semiconductor die with conductive terminals and solder balls offset from the terminal centers for lateral soldering to a printed circuit board.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
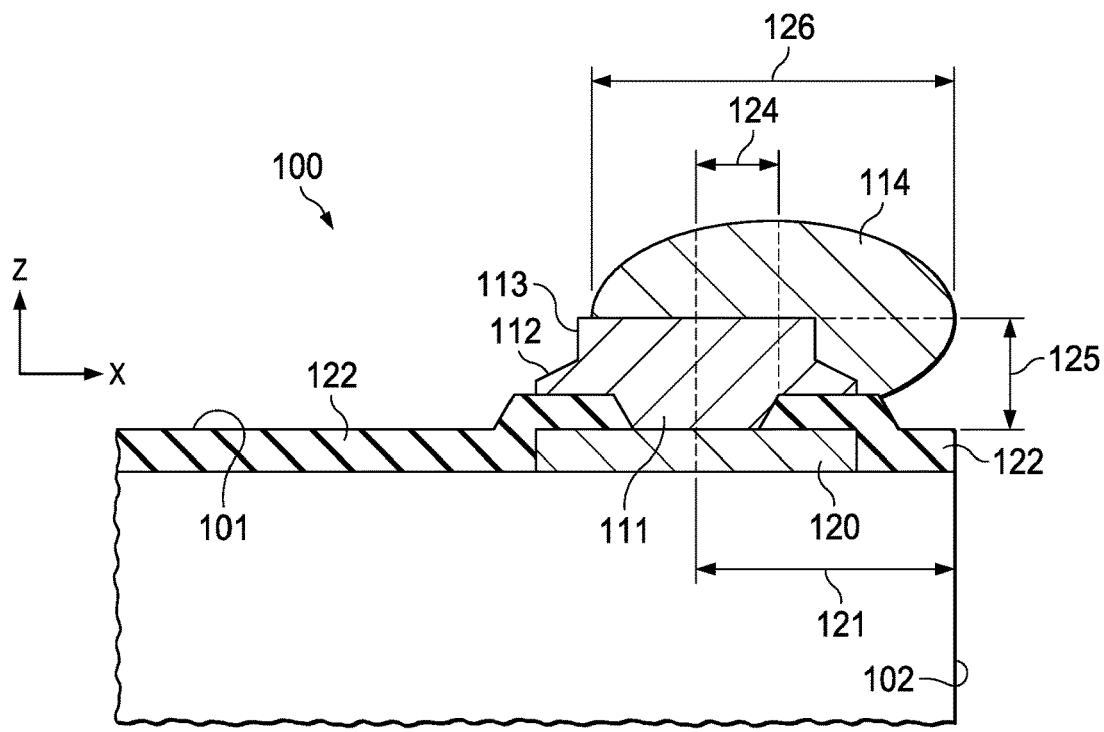
FIG. 1A is a partial sectional side elevation view taken along line 1A-1A of FIG. 1.

FIGS. 1 and 1A show a semiconductor die 100 with a generally rectangular shape. The semiconductor doe 100 has a first side 101 (e.g., a front side in the orientation shown in FIG. 1) that extends in a first plane of orthogonal first and second directions X and Y. The semiconductor die 100 also has a second side 102 (e.g., a bottom side in the orientation shown in FIG. 1). The second side 102 extends in a second plane of the first direction X and a third direction Z that is orthogonal to the first and second directions X and Y. The semiconductor die 100 also has a third (e.g., top) side 103 as well as a fourth (e.g., back) side 104, a fifth side 105, and a sixth side 106. The semiconductor die 100 has an optical sensor face 110 on the first side 101 as well as conductive terminals 111 that extend on a lower portion of the first side 101 proximate to, and spaced apart from the second side 102 along the first direction X. The illustrated example has six conductive terminals 111 to provide electrical connections (e.g., power (VDD), ground (GND), serial data (SDA), serial clock (SCL), synchronization (SYNC), and interrupt (INT) signaling) to an optical sensor circuit of the die 100, for example, to implement a circuit board level light sensor to detect light signals from a side facing photodiode (not shown) that faces the optical sensor face 110. In one example, the second side 102 can be mounted to a host PCB (e.g., FIG. 1B below), and the conductive terminals 111 have associated solder structures 114 (e.g., solder balls) for soldering to conductive pads of a host circuit board, such as a flexible PCB.

As best shown in FIG. 1A, the individual conductive terminals 111 have a respective foot portion 112 and a pillar portion 113. The individual terminals 111 have an associated solder structure 114 that extends on the conductive terminal 111. The individual conductive terminals 111 are connected to a corresponding bond pad 120 of the first side 101 (FIG. 1A). The conductive terminals 111 have a center that is spaced apart from the second side 102 by a first distance 121 along the first direction X. A protective overcoat (PO) layer 122 extends along portions of the first side 101 of the semiconductor die 100. The protective overcoat layer 122 has openings for each of the conductive terminals 111 and associated bond pads 120. The solder structure 114 has a center that is spaced apart from the center of the conductive terminal 111 by a non-zero second distance 124 along the direction X, and the second distance 124 is less than the first distance 121. The individual conductive terminals 111 have a height 125 along the third direction Z, and the solder structures 114 have a length 126 along the first direction X, where the solder structure length 126 is greater than the conductive terminal heights 125. As shown in FIG. 1A, the pillar portion 113 extends outward from the foot portion 112 along the third direction Z and away from the first side 101. The foot portion 112 is wider than the pillar portion 113 along the first direction X, and the pillar portion 113 extends outward from the foot portion 112 and away from the first side 101. As shown in FIG. 1A, the solder structure 114 extends along portions of the foot and pillar portions 112 and 113 of the conductive terminal 111. In addition, the center of the solder structure 114 is off set from the center of the conductive terminal 111 by the second distance 124 such that the solder is position closer to the second side 102.

Figure 1B:
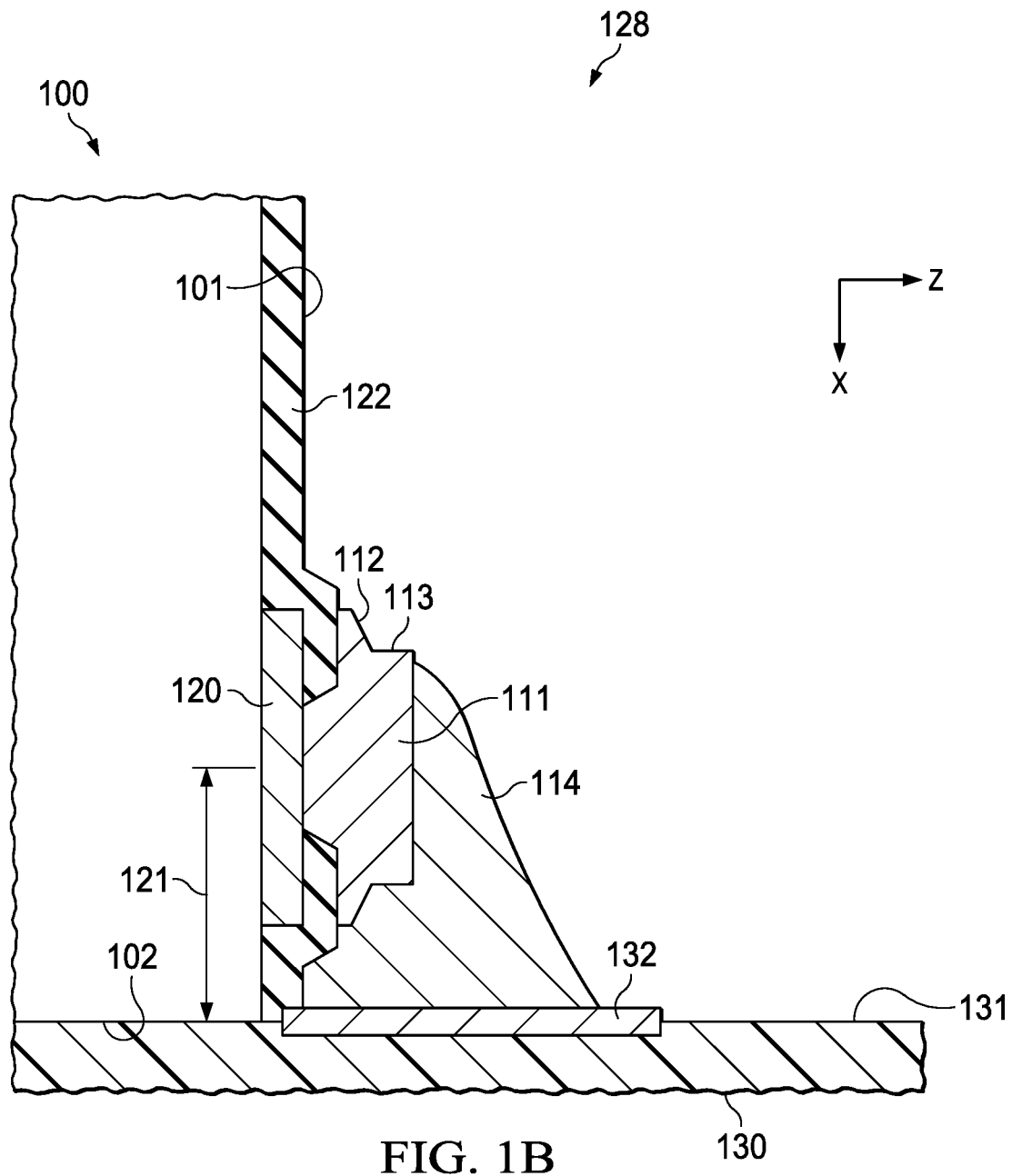
FIG. 1B is a partial sectional side elevation view of a system having the semiconductor die of FIG. 1 mounted on a printed circuit board.
Figure 2:
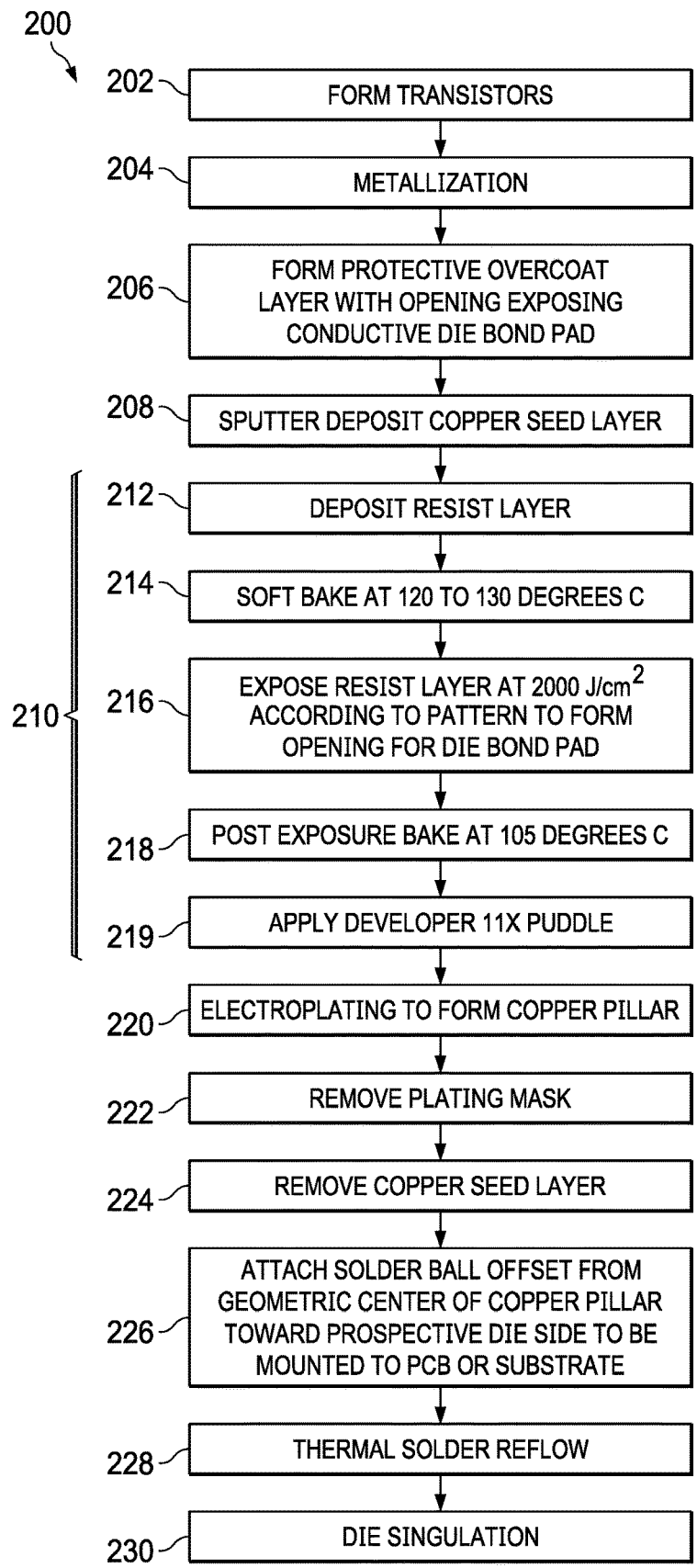
FIG. 2 is a flow diagram of a method of fabricating an electronic device.

FIG. 1B shows a system 128 that includes the semiconductor die 100 mounted on a printed circuit board 130 having a circuit board side 131 and a conductive pad 132 that extends on the circuit board side 131. In one example, the second side 102 of the semiconductor die 100 is adhered to the circuit board side 131 by an adhesive or solder, and the solder structure 114 is reflowed to create a solder connection between the conductive terminal 111 and the conductive pad 132 of the circuit board 130. The initial offset of the solder structure 114 toward the second side 102 of the semiconductor die 100 facilitates proper wetting of the resulting lateral or side facing solder joint between the conductive terminal 111 and the conductive pad 132 without the shortcomings associated with simply increasing the amount of solder. The provision of the wide foot portion 112 of the conductive terminal 111 also helps offset the solder structure 114 toward the second side 102 of the semiconductor die 100 by supporting the offset portion of the solder 114 close to the second side 102 for robust and reliable solder connection to the circuit board 130.

Figure 3:
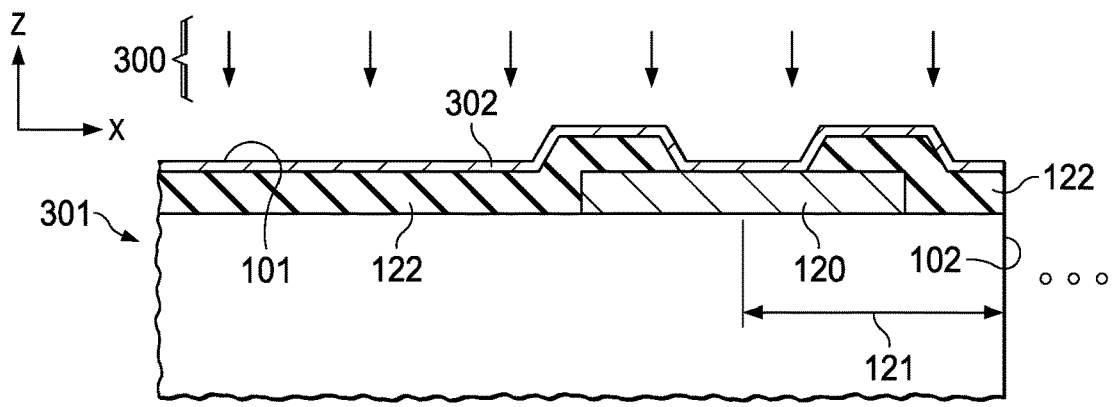
FIGS. 3-17 are partial sectional side elevation views of the electronic device of FIG. 1 undergoing fabrication processing according to the method of FIG. 2.

Referring also to FIGS. 2-17, FIG. 2 shows a method 200 of fabricating an electronic device and FIGS. 3-17 show the semiconductor die 100 undergoing fabrication processing according to the method 200. The method 200 includes wafer level processing with transistor formation at 202 and metallization processing at 204 to form the uppermost metallization level with the conductive bond pad 120 of the first side 101 of a semiconductor wafer 301 as shown in FIG. 3. The wafer 301 in one example is a silicon wafer or silicon-on-insulator (SOI) wafer processed at 202 and 204 according to suitable fabrication techniques and processing steps. At 206, the protective overcoat layer 122 is formed (e.g., deposited and patterned) to extend on the first side 101 and to expose all or a portion of the top side of the bond pad 120.

Continuing at the wafer level at 208, the method 200 includes depositing a metal seed layer. FIG. 3 shows one example, in which a deposition process 300 is performed that deposits a copper seed layer 302 on the bond pad 120 of the first side 101 of the semiconductor wafer 301. In the illustrated example, the process 300 is a blanket deposition that forms the copper seed layer 302 in a generally conformal manner on the exposed top side of the bond pad 120 and on the top side of the protective overcoat layer 122 as shown in FIG. 3.

Figure 4:
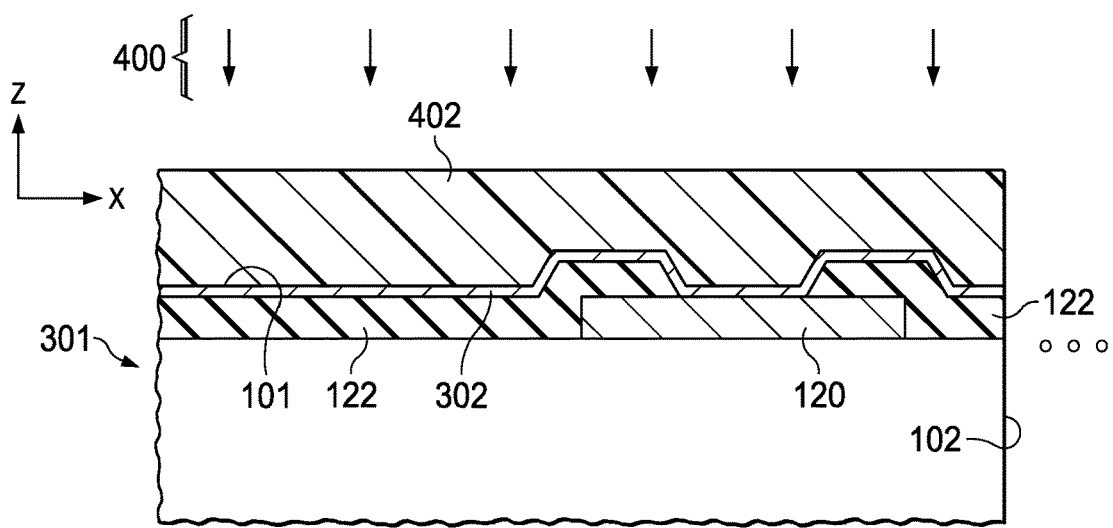
Figure 5:
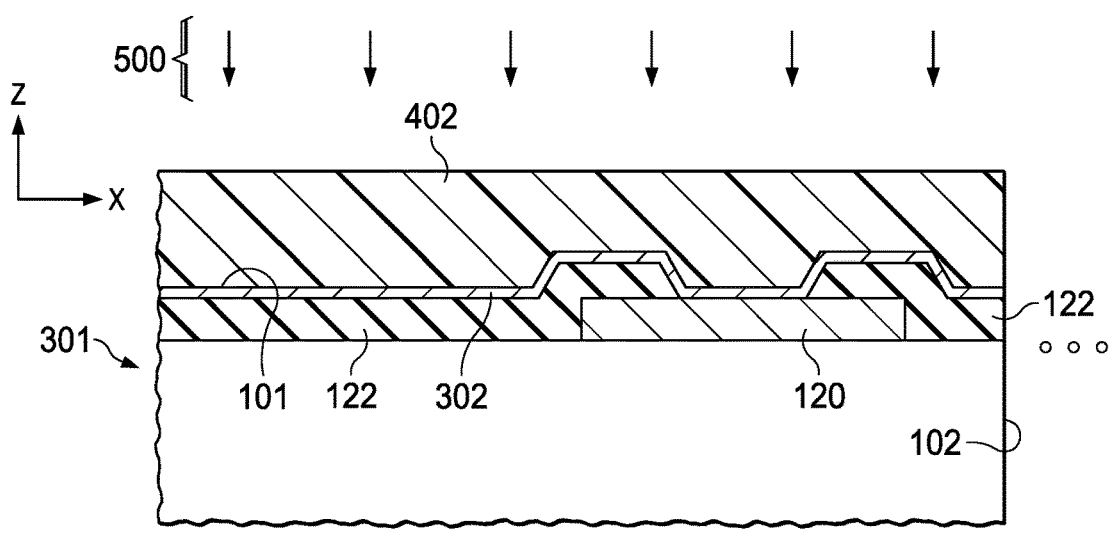

Referring also to FIGS. 4-10, the method 200 also includes lithography processing at 210. FIGS. 4, 5, and 8-10 show one example of a multi-step lithography process at 210 that forms a patterned plating mask with an opening having an undercut that exposes the metal seed layer 302. A resist layer is deposited at 212 in this example. FIG. 4 shows one example, in which a deposition process 400 is performed that deposits a resist layer 402 on the metal seed layer 302. The thickness can be adjusted for a given desired terminal height, where the resist layer thickness above the bond pad 120 is generally greater than the desired final terminal height. A soft bake is performed at 214. FIG. 5 shows one example, in which a first bake process 500 is performed that heats the resist layer 402 to a first bake temperature of 120 to 130 degrees C. In one implementation, the first bake temperature is approximately 125 degrees C. (i.e., 124 to 126 degrees C.). Initial heating outside this range and particularly above this range can lead to insufficient refraction during subsequent exposure and can mitigate the benefits of the foot portion 112 of the conductive terminal 111.

Figure 6:
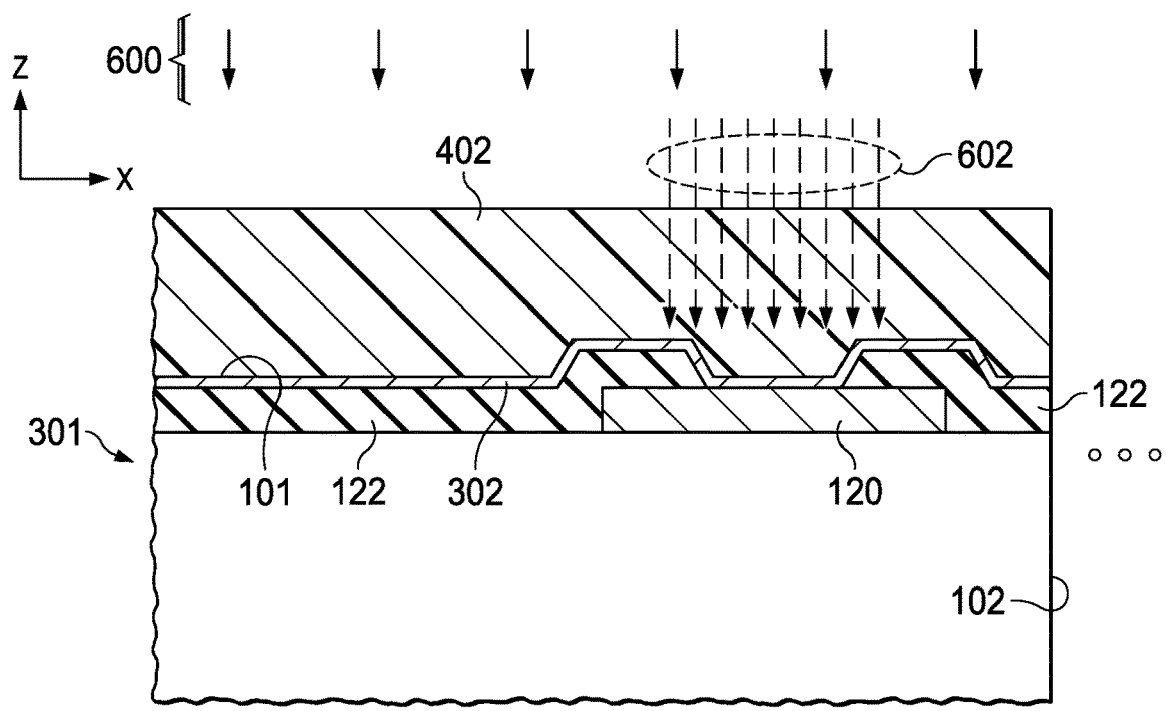
Figure 7:
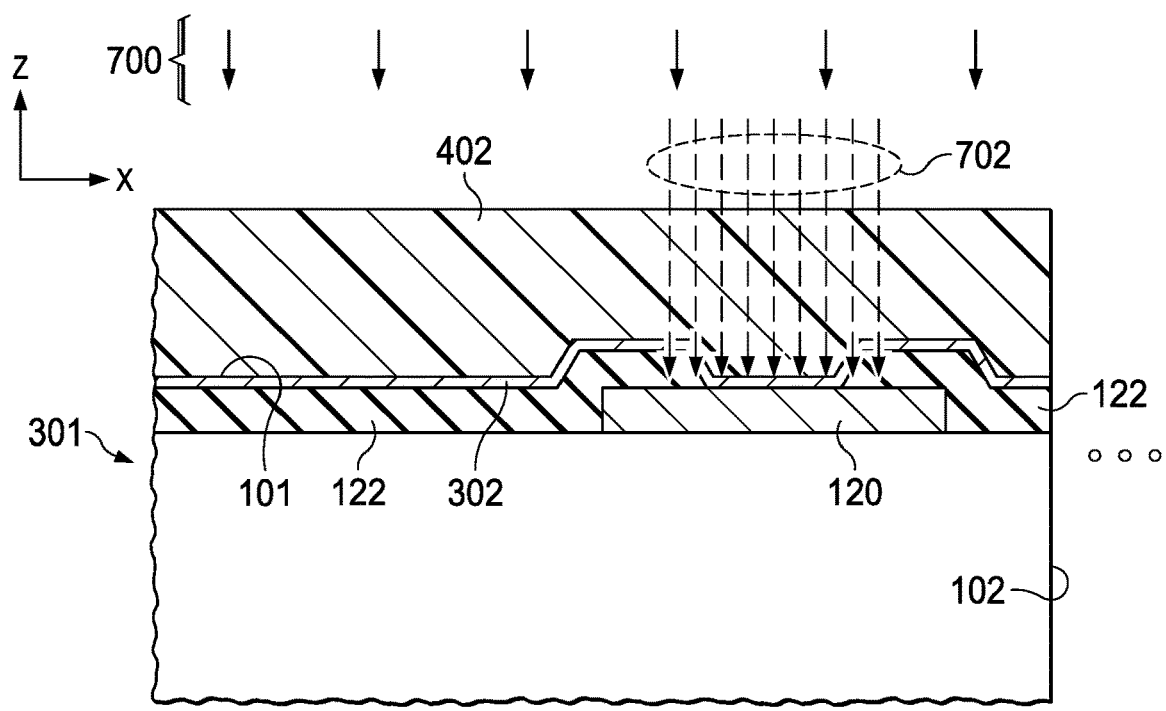
Figure 8:
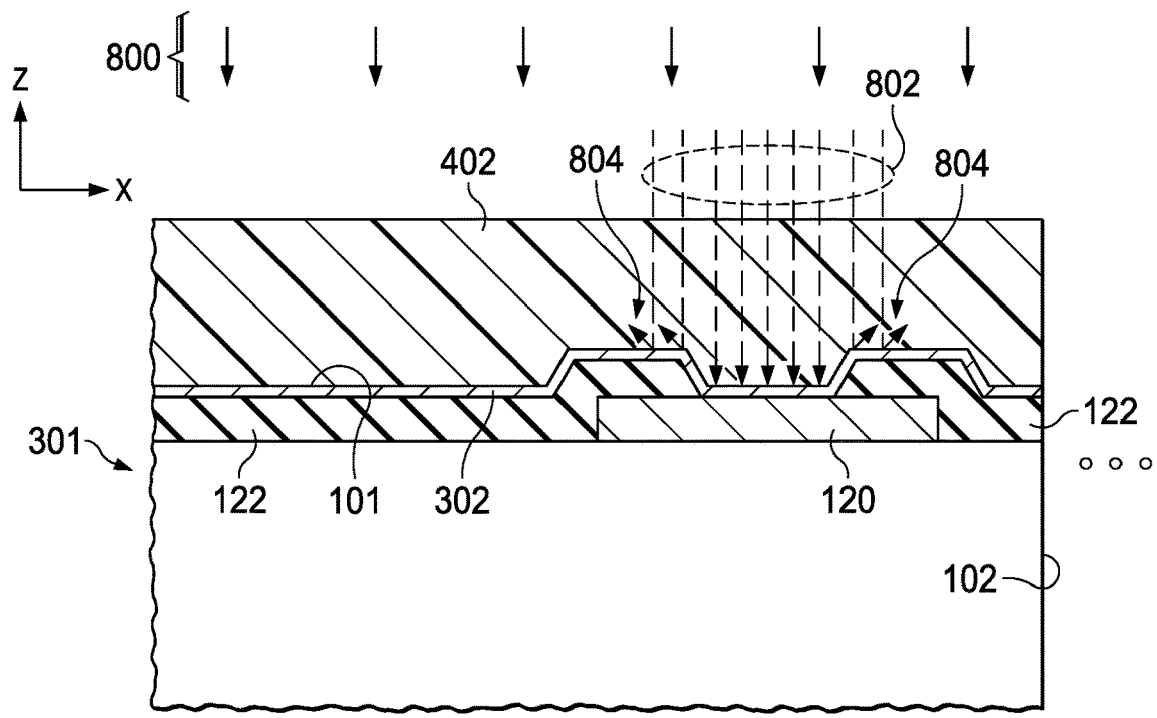

Referring to FIGS. 6-8, the method 200 continues with exposure processing at 216 using photolithographic equipment (not shown) to expose a prospective opening portion of the resist layer 402 to light at an exposure energy that causes refraction of the light into a prospective undercut portion of the resist layer 402. FIG. 6 shows an exposure process 600 at a low first exposure energy (e.g., less than 1800 mJ/cm$^2$) that does not propagate light 602 deep enough to properly expose the resist material to the metal seed layer 302 above the bond pad 120 in a desired prospective opening portion of the resist layer 402. FIG. 7 shows an exposure process 700 at a higher exposure energy (e.g., approximately 1800 mJ/cm$^2$) that propagates light 702 deep enough to properly expose the resist material to the metal seed layer 302 above the bond pad 120 in the desired prospective opening portion of the resist layer 402 but does not create significant light refraction. At this exposure energy level, no undercut will be created in the resulting patterned plating mask opening.

In the illustrated implementation, the exposure energy is set at 216 such that the resulting prospective opening portion of the resist layer 402 is exposed to light to cause refraction of the light into a prospective undercut portion of the resist layer 402. FIG. 8 shows an exposure process 800 at an even higher exposure energy (e.g., approximately 2000, i.e., 2000+/−1000 mJ/cm$^2$) that propagates light 802 deep enough to properly expose the resist material to the metal seed layer 302 above the bond pad 120 in the desired prospective opening portion of the resist layer 402 and to cause significant light refraction 804 in a prospective undercut portion of the resist material proximate to and laterally outward of the metal seed layer 302 above the bond pad 120.

Figure 9:
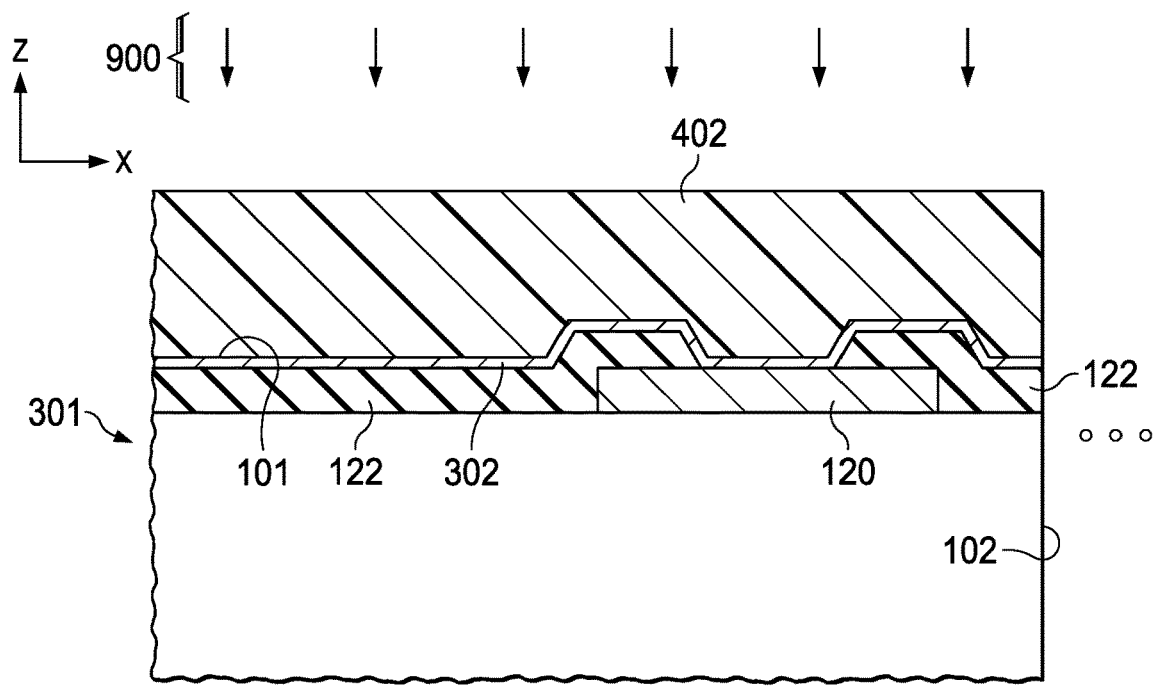

The lithography processing 210 continues at 218 with a second or post exposure bake process. FIG. 9 shows one example, in which a second bake process (post exposure bake process) 900 is performed that heats the resist layer 402 to a second bake temperature. In one example, the second bake temperature is approximately 105 degrees C. (i.e., 104 to 106 degrees C.). Post exposure bake heating outside this range and particularly below this range can lead to insufficient development and removal of the resist material in a desired undercut portion of the resulting patterned plating mask and inhibit the subsequent plating to create the desired foot portion 112 of the conductive terminal 111.

Figure 10:
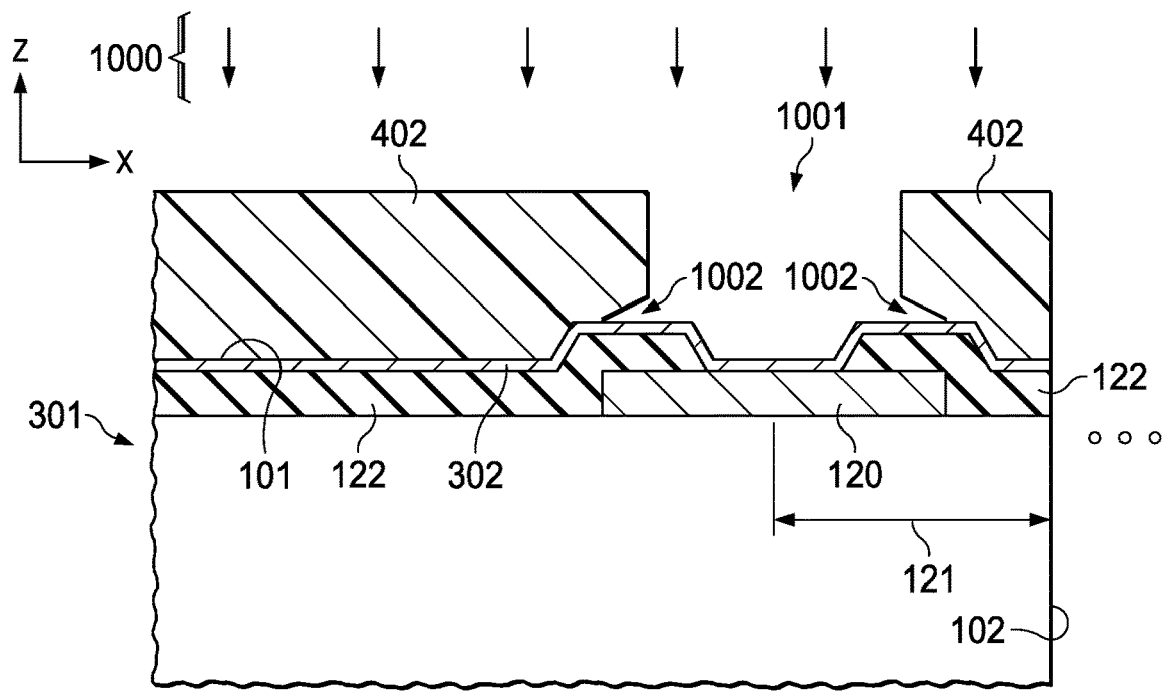

The lithography at 210 continues at 219 with developer application processing. FIG. 10 shows one example, in which a development process 1000 is performed that applies a developer solution to the resist layer 402 to remove the exposed prospective opening portion of the resist layer 402. As shown in FIG. 10, the process 1000 forms an opening 1001 in the patterned plating mask/resist layer 402 with an undercut 1002 that exposes the metal seed layer 302. The opening 1001 has a center that is spaced apart from a prospective die second side 102 of the wafer 301 by the first distance 121 along the first direction X. The development process 1000 is performed with an 11 X puddle (e.g., developer solution at a depth approximately 10-12 times the thickness of the resist layer 402). Development outside this range and particularly below this puddle depth can lead to insufficient removal of the exposed resist material, in particular, insufficient formation of the desired undercut 1002 of the opening 1001.

Figure 11:
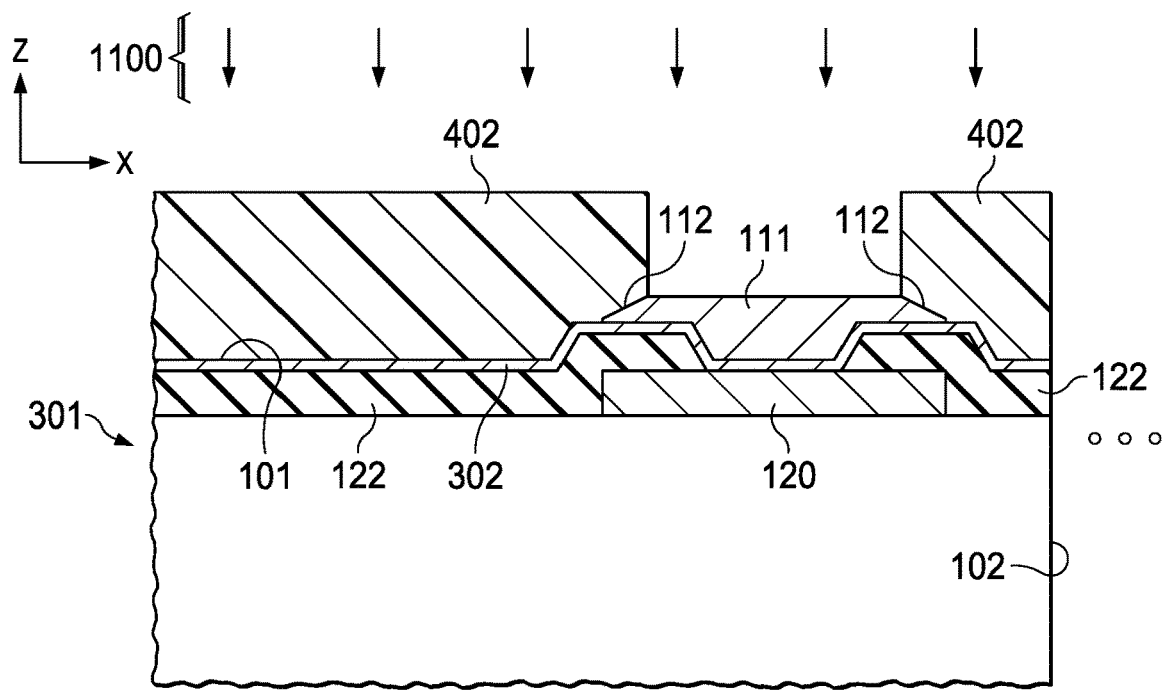
Figure 12:
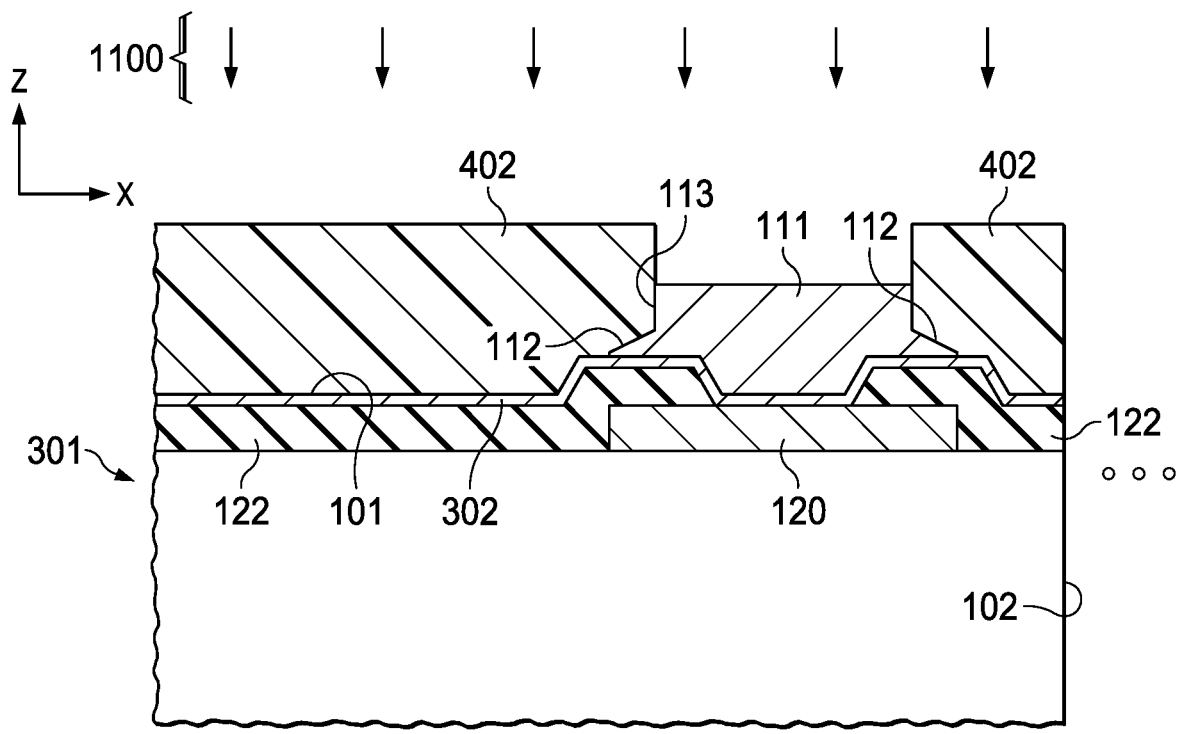

The method 200 continues with electroplating at 220. FIGS. 11 and 12 show one example in which an electroplating process 1100 is performed that forms the conductive terminal 111 in the opening 1001 with the foot portion 112 and the pillar portion 113. The process 1100 in FIG. 11 electroplates copper material in the lower part of the opening including formation of plated copper foot portion 112 in the undercut of the opening, and the process 1100 is continued as shown in FIG. 12 to complete the pillar portion 113 of the conductive terminal 111. As shown in FIG. 12, the plated copper conductive terminal 111 includes the pillar portion 113 extending outward from the foot portion 112 along the third direction Z away from the first side 101 of the semiconductor die 100 to a desired final height, with the foot portion 112 extending in the undercut 1002 and being wider than the pillar portion 113 along the first direction X.

Figure 13:
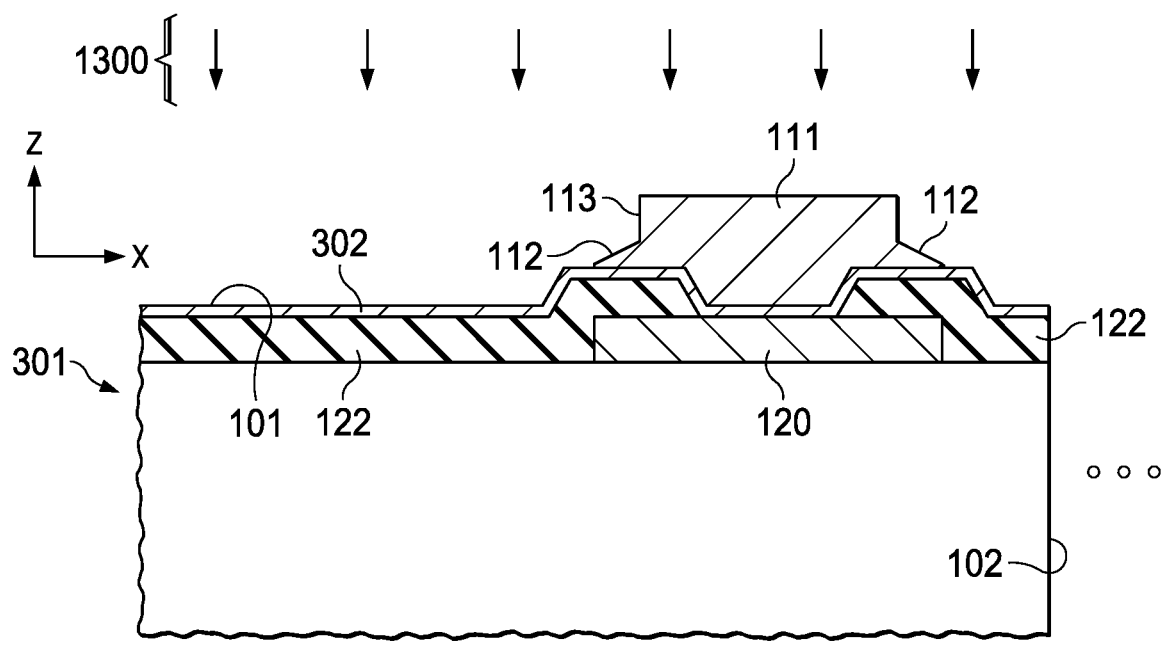
Figure 14:
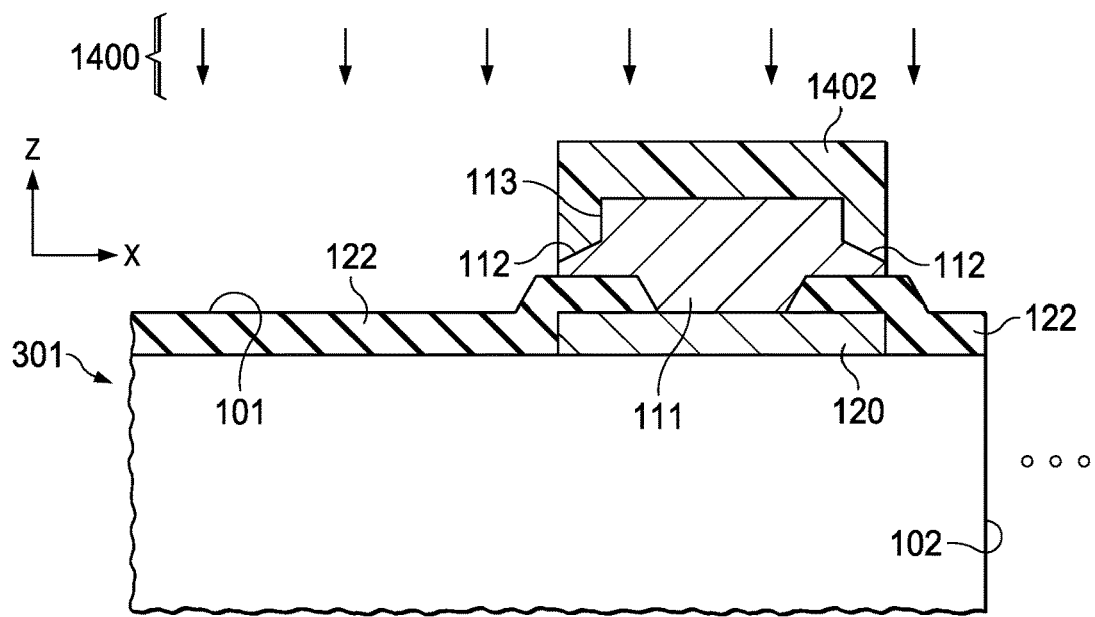

The method 200 continues with removing the plating mask 402 at 222. FIG. 13 shows one example, in which a resist stripping process 1300 is performed that removes the plating mask 402 and leaves the completed conductive terminal 111. At 224 a copper etch is performed to remove the remaining copper seed layer 302 from the exposed portion of the first side 101 of the wafer 301. FIG. 14 shows one example, in which an etch process 1400 is performed with a patterned etch mask 1402 to remove any remaining exposed copper seed layer 302 from the top of the protective overcoat layer 122.

Figure 15:
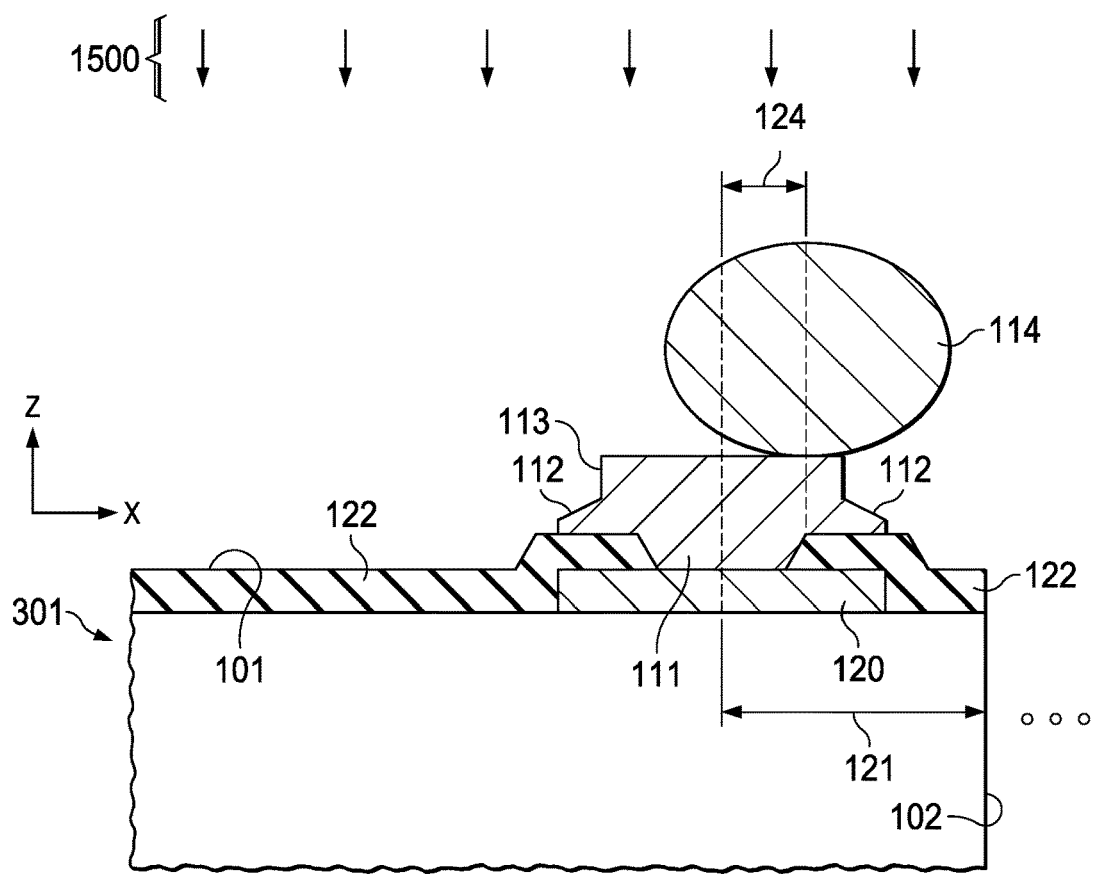

The method continues with solder ball attachment at 226. FIG. 15 shows one example, in which a solder ball attach (e.g., ball drop) process 1500 is performed that attaches a solder structure 114 (e.g., a generally round solder ball) on the conductive terminal 111 using a stencil (not shown) that aligns the attached solder structure 114 with the center of the solder ball spaced apart from the center of the conductive terminal 111 by the non-zero second distance 124 along the first direction X toward the prospective die second side 102, where the second distance 124 is less than the first distance 121. This preferentially locates the solder structure 114 closer to the prospective die side 102 to be attached to a PCB in a host system (e.g., FIG. 1B above).

Figure 16:
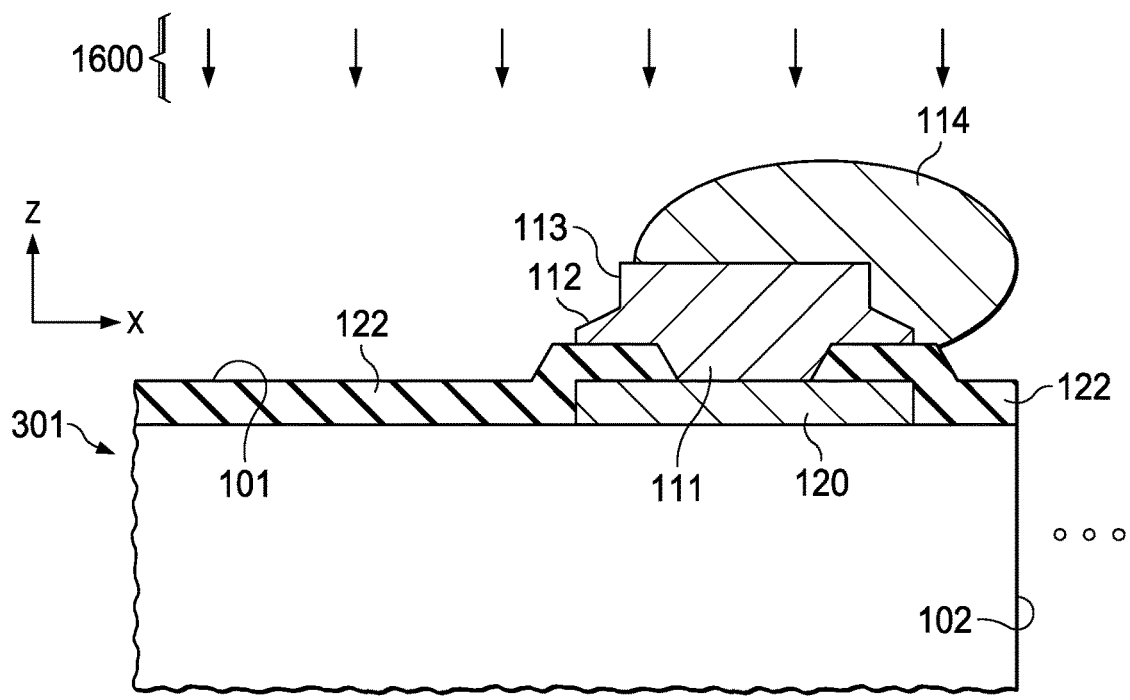
Figure 17:
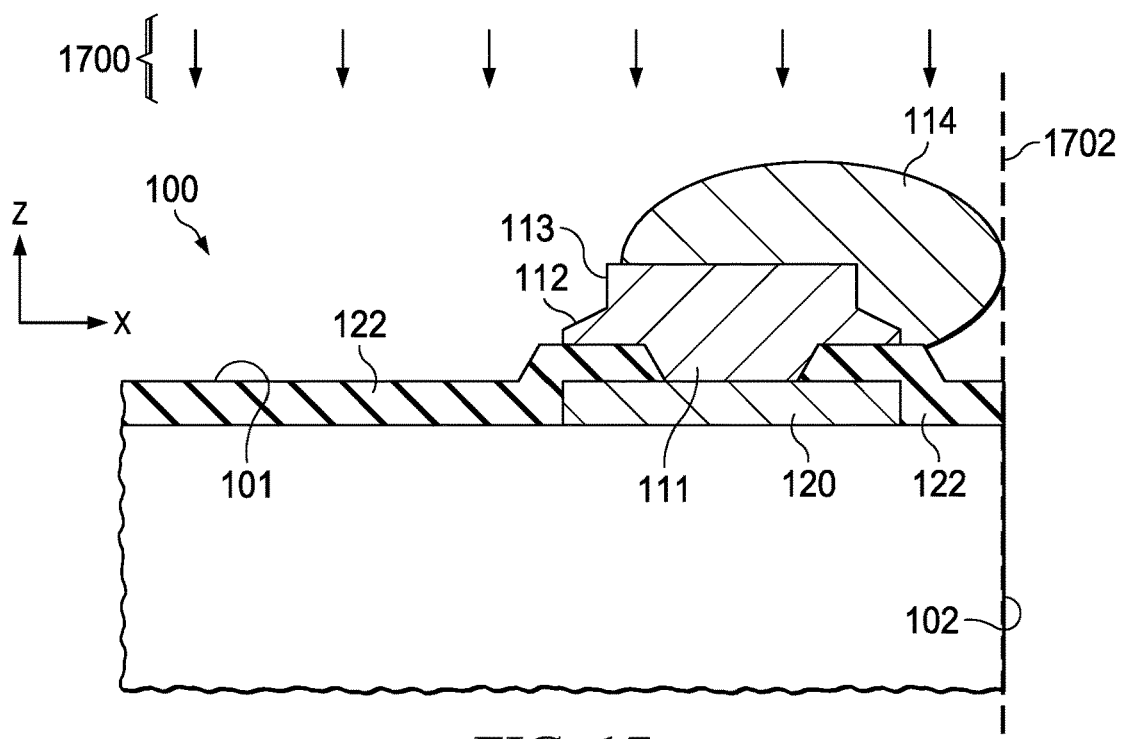

The method 200 further includes thermal solder reflow processing at 228. FIG. 16 shows one example, in which a thermal reflow (e.g., heating) process 1600 is performed that reflows the solder ball to spread out the solder structure 114 downward and laterally to extend along portions of the respective pillar and foot portions 113 and 112 of the conductive terminal 111 nearest to the prospective second die side 102. The method 200 includes die separation or singulation at 230 to separate individual semiconductor dies 100 from the semiconductor wafer 301. FIG. 17 shows one example, in which the processed wafer 301 is cut in a die separation process 1700 (e.g., using a saw and/or laser, not shown) along scribe lines 1702 to form the die second side 102 of the respective semiconductor dies 100.

The described method 200 combines intended lithographic creation of the foot portion 112 of the conductive structure facing the prospective second die side 102 with lateral offset of the solder ball attachment toward the prospective second side 102. The resulting structure facilitates good solder wetting and reliable side facing or lateral solder connection of the conductive terminal 111 during subsequent die attachment and soldering to a host PCB (e.g., circuit board 130 in FIG. 1B). This solution does not suffer from the disadvantages of simply increasing the solder ball size, and this mitigates unintended short circuiting of adjacent terminals by allowing the use of smaller balls in combination with potentially tighter under bump metallization (UBM) pad pitch configurations. In another implementation, if UBM pads are spaced further away from die edge near the second side 102, the described examples and techniques enhance flexibility in using the same sized solder ball without increasing the solder ball size.

Modifications are possible in the described examples, and other implementations are possible, within the scope of the claims.

What is claimed is:

1. An electronic device, comprising:
    a semiconductor die having a first side, a second side, and a conductive terminal, the second side orthogonal to the first side, the conductive terminal on the first side, and the conductive terminal having a center that is spaced apart from the second side by a first distance along a direction; and
    a solder structure abutting the conductive terminal, the solder structure having a center that is spaced apart from the center of the conductive terminal by a non-zero second distance along the direction.

2. The electronic device of claim 1, wherein the second distance is less than the first distance.

3. The electronic device of claim 1, wherein the conductive terminal includes copper.

4. An electronic device, comprising:
    a semiconductor die having a first side, a second side, and a conductive terminal, the second side orthogonal to the first side, the conductive terminal on the first side, and the conductive terminal having a center that is spaced apart from the second side by a first distance along a direction; and
    a solder structure extending on the conductive terminal, the solder structure having a center that is spaced apart from the center of the conductive terminal by a non-zero second distance along the direction, wherein the second distance is less than the first distance, wherein:
        the conductive terminal has a foot portion and a pillar portion;
        the pillar portion extends outward from the foot portion and away from the first side; and
        the solder structure extends along portions of the foot and pillar portions of the conductive terminal.

5. The electronic device of claim 4, wherein:
    the conductive terminal has a height along another direction that is perpendicular to a plane of the first side;
    the solder structure has a length along the direction; and the length of the solder structure is greater than the height of the conductive terminal.

6. An electronic device, comprising:
a semiconductor die having a first side, a second side, and a conductive terminal, the second side orthogonal to the first side, the conductive terminal on the first side, and the conductive terminal having a center that is spaced apart from the second side by a first distance along a direction; and
a solder structure extending on the conductive terminal, the solder structure having a center that is spaced apart from the center of the conductive terminal by a non-zero second distance along the direction, wherein:
the conductive terminal has a height along another direction that is perpendicular to a plane of the first side;
the solder structure has a length along the direction; and
the length of the solder structure is greater than the height of the conductive terminal.

7. An electronic device, comprising:
a semiconductor die having a first side, a second side, and a conductive terminal, the second side orthogonal to the first side, the conductive terminal on the first side, and the conductive terminal having a center that is spaced apart from the second side by a first distance along a direction; and
a solder structure extending on the conductive terminal, the solder structure having a center that is spaced apart from the center of the conductive terminal by a non-zero second distance along the direction, wherein:
the conductive terminal has a foot portion and a pillar portion;
the pillar portion extends outward from the foot portion and away from the first side; and
the solder structure extends along portions of the foot and pillar portions of the conductive terminal.

8. The electronic device of claim 7, wherein the foot portion is wider than the pillar portion along the direction.

9. A system, comprising:
a circuit board having a circuit board side and a conductive pad extending on the circuit board side;
a semiconductor die having a first side extending in a first plane of orthogonal first and second directions, a second side, and a conductive terminal, the second side extending in a second plane of the first direction and a third direction, the third direction orthogonal to the first and second directions, the conductive terminal on the first side, the conductive terminal having a foot portion and a pillar portion, the pillar portion extending outward from the foot portion along the third direction and away from the first side, the foot portion being wider than the pillar portion along the first direction, and the conductive terminal having a center that is spaced apart from the second side by a first distance along the first direction; and
a solder structure extending on a portion of the conductive pad and on portions of the foot and pillar portions of the conductive terminal.

10. The system of claim 9, wherein:
the conductive terminal has a height along the third direction;
the solder structure has a length along the first direction; and
the length of the solder structure is greater than the height of the conductive terminal.

11. The system of claim 10, wherein the foot portion is wider than the pillar portion along the first direction.

12. The system of claim 9, wherein the foot portion is wider than the pillar portion along the first direction.

13. The system of claim 9, wherein the conductive terminal includes copper.

14. An electronic device, comprising:
a semiconductor die having a first side extending in a first plane of orthogonal first and second directions, a second side, and a conductive terminal, the second side extending in a second plane of the first direction and a third direction, the third direction orthogonal to the first and second directions, the conductive terminal on the first side, the conductive terminal having a foot portion and a pillar portion, the pillar portion extending outward from the foot portion along the third direction and away from the first side, the foot portion being wider than the pillar portion along the first direction, and the conductive terminal having a center that is spaced apart from the second side by a first distance along the first direction.

15. The electronic device of claim 14, further including a solder structure extending on a portion of the conductive pad and on portions of the foot and pillar portions of the conductive terminal.

16. The electronic device of claim 15, wherein:
the conductive terminal has a height along the third direction;
the solder structure has a length along the first direction; and
the length of the solder structure is greater than the height of the conductive terminal.

17. The electronic device of claim 16, wherein the foot portion is wider than the pillar portion along the first direction.

18. The electronic device of claim 14, wherein the foot portion is wider than the pillar portion along the first direction.

19. The electronic device of claim 14, wherein the conductive terminal includes copper.

* * * * *